United States Patent
Matsuno

(10) Patent No.: US 7,400,010 B2
(45) Date of Patent: Jul. 15, 2008

(54) SEMICONDUCTOR DEVICE AND METHOD OF MANUFACTURING THE SAME

(75) Inventor: Koichi Matsuno, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 66 days.

(21) Appl. No.: 11/438,367

(22) Filed: May 23, 2006

(65) Prior Publication Data

US 2006/0289926 A1    Dec. 28, 2006

(30) Foreign Application Priority Data

May 24, 2005    (JP) .............................. 2005-150955

(51) Int. Cl.
*H01L 29/788* (2006.01)
*H01L 21/336* (2006.01)

(52) U.S. Cl. .............................. 257/316; 257/E21.546; 257/E29.3; 438/257; 438/593; 438/424

(58) Field of Classification Search ......... 257/314–316, 257/E27.103, E29.301, E21.546, E29.3; 438/201, 438/211, 257, 593, 424, 435
See application file for complete search history.

(56) References Cited

U.S. PATENT DOCUMENTS

| 6,661,052 B2 | 12/2003 | Matsui et al. |
| 6,784,503 B2 | 8/2004 | Shimizu et al. |
| 7,151,295 B2 * | 12/2006 | Yaegashi et al. ............ 257/316 |
| 2005/0287742 A1 * | 12/2005 | Kang ......................... 438/257 |
| 2006/0246662 A1 * | 11/2006 | Matsuzaki .................. 438/257 |

FOREIGN PATENT DOCUMENTS

JP    2002-110822    4/2002

OTHER PUBLICATIONS

U.S. Appl. No. 11/438,367, filed May 23, 2006, Matsuno.
U.S. Appl. No. 11/871,591, filed Oct. 12, 2007, Miyazaki.

* cited by examiner

*Primary Examiner*—M. Wilczewski
*Assistant Examiner*—Toniae M. Thomas
(74) *Attorney, Agent, or Firm*—Oblon, Spivak, McClelland, Maier & Neustadt, P.C.

(57) ABSTRACT

A semiconductor device including a semiconductor substrate having trenches oriented in a predetermined direction; a gate insulating film overlaying the semiconductor substrate interposed between the trenches; and floating gate electrodes formed on the gate insulating film aligned in a predetermined direction and in a direction intersecting thereto, an element isolation insulating film filling the trenches such that an upper surface thereof is higher than an upper surface of the adjoining gate insulating film, wherein the element isolation insulating film includes a first element isolation insulator interposed between neighboring floating gate electrodes in the intersecting direction and a second element isolation insulator interposed between neighboring first element isolation insulators in the predetermined direction. The second element isolation insulator has a sidewall oriented in the predetermined direction, a height thereof from the gate insulating film upper surface being lower than a boundary between the first and the second isolation insulators.

5 Claims, 16 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2005-150955, filed on, May 24, 2005 the entire contents of which are incorporated herein by reference.

BACKGROUND OF THE INVENTION

1. Field of Invention

The present invention relates to a semiconductor device provided with element isolation regions filled with element isolation insulating films, and a method of manufacturing the same.

2. Description of the Related Art

Recently, a semiconductor device, particularly a non-volatile semiconductor storage device is manufactured by employing a process in which a gate electrode is formed prior to forming an element isolation region of STI (Shallow Trench Isolation) configuration. As disclosed in JP-A-2002-110822, such process forms a gate insulating film on a semiconductor substrate whereupon a film (a floating gate, for example) is further formed that constitutes a gate electrode. Thereafter an element isolation trench filled with an element isolation insulation film is formed in a predetermined direction in the substrate surface. Thus, the gate insulating film and gate electrode are processed.

The method disclosed in JP-A-2002-110822 involves the following steps. A tunnel insulating film (corresponding to gate insulating film) is formed by thermal oxidation process over a silicon substrate (corresponding to a semiconductor substrate). Formed thereafter is a polycrystalline silicon layer (corresponding to a floating gate electrode film) doped with impurities. Then, a silicon nitride film serving as a stopper for CMP (Chemical Mechanical Polish) process is formed whereafter a silicon oxide film used as a mask in RIE process is formed by LPCVD (Low-Pressure Chemical Vapor Deposition). Subsequently, the silicon oxide film, silicon nitride film, polycrystalline silicon layer, and tunnel insulating film are etched sequentially. Then, the silicon substrate is etched to form the element isolation trench.

After several successions of steps, the element isolation trench is completely filled with silicon oxide film deposited by plasma CVD process and the silicon oxide film overlaying the silicon nitride film is planarized by CMP process. Finally, the silicon nitride film serving as a stopper film is removed. The floating gate electrode, the gate insulating film and the element isolation insulating film are formed by the above described process.

In employing the manufacturing method disclosed in JP-A-2002-110822, each film is deposited over the semiconductor substrate surface in a predetermined film thickness. Trenches oriented in a predetermined direction are formed on the substrate surface and the element isolation insulating film is filled therein. Then, an impurity-doped polycrystalline silicon layer having high electrical conductivity is removed in an intersecting direction that intersects the predetermined direction in the substrate surface. Subsequently, by isolating the adjoining floating gate electrodes, two-dimensional floating gate electrodes are formed over the semiconductor substrate surface.

Thus, floating gate electrodes of high spatial efficiency can be formed on the semiconductor substrate surface. This method isolates the floating gate electrode films in two dimensions namely in the predetermined direction and the intersecting direction by removing the floating gate electrode film formed over the semiconductor substrate surface. However, the upper surface of the element isolation insulating film needs to be formed higher than the gate insulating film upper surface. Therefore, the attempt to completely remove the floating gate electrode film formed between the element isolation insulating films fails, leaving remainder floating gate electrode film along the sidewall of the element isolation insulating film in the trench forming direction (predetermined direction). This leads to an electrical conductive connection between the neighboring floating gates in the predetermined direction, which requires defective influence on the device.

Nowadays, subject to the increasing need to scale-down the circuit design rules, the width of the floating gate electrode film interposed between the element isolation insulating films is becoming narrower. This leads to an increase in the trench aspect ratio, requiring critical etching conditions upon removing the floating gate electrode film formed in the gate electrode isolation region.

BRIEF SUMMARY OF THE INVENTION

Therefore, an object of the present invention is to provide a semiconductor device that prevents an establishment of electrically conductive connection between the neighboring floating gate electrodes and a method of manufacturing the same.

The semiconductor device of the present invention includes a semiconductor substrate having a plurality of trenches formed so as to be oriented in a predetermined direction; a gate insulating film formed on the semiconductor substrate surface between the plurality of trenches; and a plurality of floating gate electrode formed on the gate insulating film so as to be aligned in a predetermined direction and in a direction that intersects with the predetermined direction. The semiconductor device also includes an element isolation insulating film that fills the plurality of trenches respectively such that an upper surface thereof is positioned higher than an upper surface of the adjoining gate insulating film, wherein the element isolation insulating film includes a first element isolation insulator interposed between neighboring floating gate electrodes in the intersecting direction and a second element isolation insulator interposed between neighboring first element isolation insulators in the predetermined direction. The second element isolation insulator has a sidewall oriented in the predetermined direction, a height of a substantial mid-portion of the sidewall from the gate insulating film upper surface being lower than a boundary between the first element isolation insulator and the second isolation insulator.

A method of manufacturing a semiconductor device of the present invention involves forming gate insulating film on a semiconductor substrate surface; forming a floating gate electrode film on the gate insulating film; dividing the floating gate electrode film and the gate insulating film into plurality by forming trenches oriented in a predetermined direction, with respect to the floating gate electrode film, the gate insulating film and the semiconductor substrate; forming an inter-gate insulating film so as to cover the floating gate electrode film and the element isolation insulator film; and forming a control gate electrode film on the inter-gate insulating film. The method also involves dividing the control gate electrode film into plurality by removing the inter-gate insulating film and the element isolation insulating film in an intersecting direction that intersects the predetermined direction; removing the inter-gate insulating film and the element isolation insulating film in a substantial central portion below a control gate electrode film removing region, wherein in a dividing region in which the control gate is divided, the inter-gate insulating film formed on the floating gate electrode film is removed by removing the inter-gate insulating film and the element isolation insulating film disposed below the control gate electrode film removing region while retaining the inter-gate insulating film and the element isolation insulating film along an edge portion of the inter-gate insulating film and the element isolation insulating film formed below the divided control gate electrode film; and removing the floating gate electrode film in the dividing region by an anisotropic etch.

BRIEF DESCRIPTION OF THE DRAWINGS

Other objects, features and advantages of the present invention will become clear upon reviewing the following description of the embodiment with reference to the accompanying drawings, in which.

DETAILED DESCRIPTION OF THE PREFERRED EMBODIMENT

Figure 1:
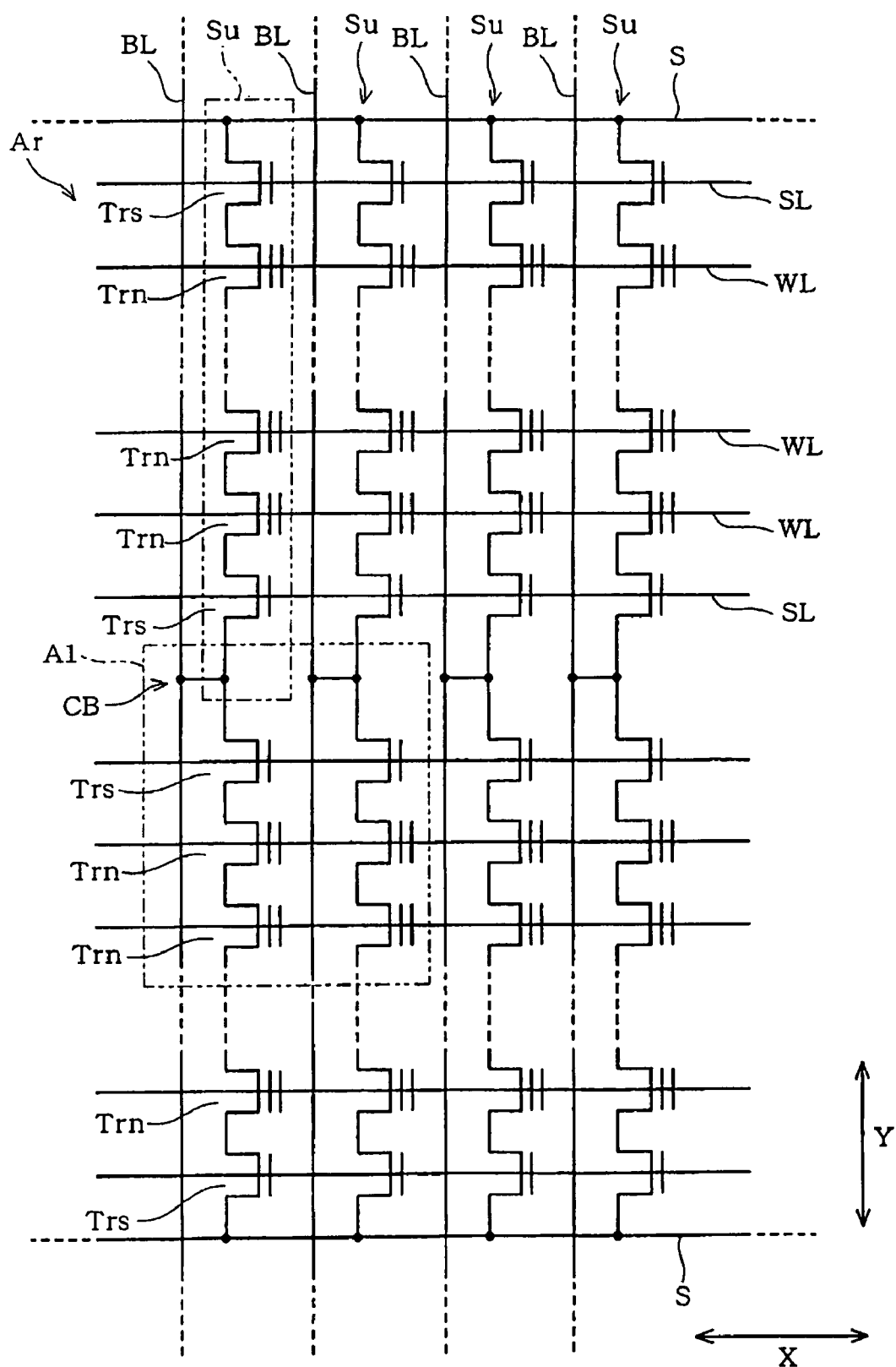
FIG. 1 illustrates an equivalent circuit of memory cell array in a NAND flash memory device indicating one embodiment of the present invention.
Figure 2:
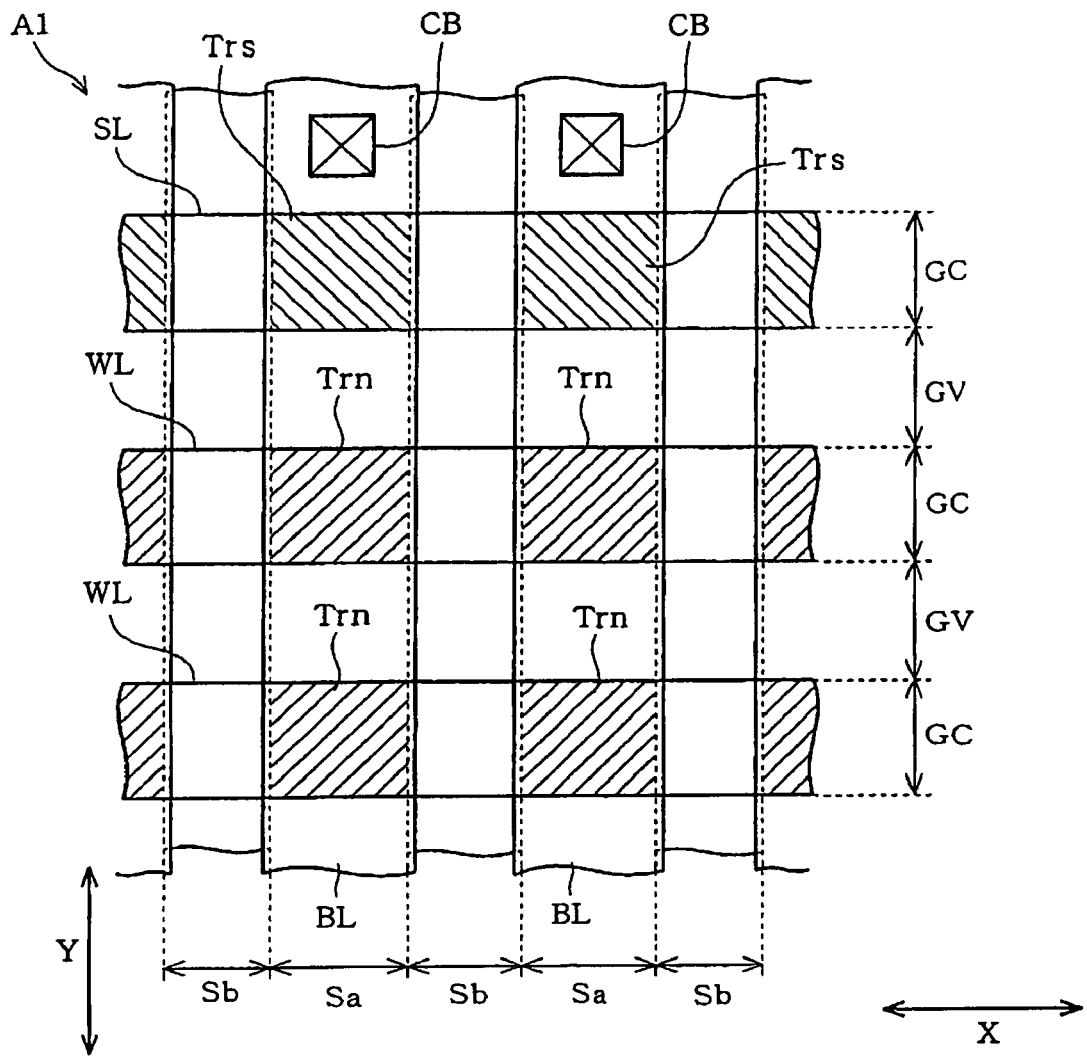
FIG. 2 is a schematic plan view of a memory cell.

The first embodiment applying the present invention to a flash memory will be described with reference to FIGS. 1 to 18. FIG. 1 illustrates an equivalent circuit of a memory cell array in a NAND flash memory device. FIG. 2 illustrates a schematic plan view of a memory cell configuration in a partial region A of FIG. 1.

Memory array Ar comprises NAND cell units SU arranged in an array of rows and columns. The NAND cell unit is constituted by a plurality (eight for example: nth power of 2 (n is a positive number)) of memory cell transistors Trn. The memory cell transistors Trn disposed between a couple of select gate transistors Trs are connected in series by sharing the source/drain region.

Referring to FIG. 1, memory cell transistors Trn aligned in the X-direction are connected to a word line (control gate line) WL. Also, the select gate transistors Trs aligned in the X-direction are connected to a select gate line SL. The select gate transistors Trs are further connected to a bit line BL, extending in the Y-direction perpendicular to (intersecting) the X-axis, via bit line contact CB.

Referring to FIG. 2, the memory cell transistors Trn and the select gate transistors Trs are formed at predetermined intervals on the intersections of an element forming region (active area) Sa and the word line WL. The element forming region (active area) Sa extends in the Y-axis direction and is isolated by element isolating region Sb of an STI (Shallow Trench Isolation) structure. The word line WL extends in the X-axis direction and is arranged at predetermined intervals in the Y-direction.

The present embodiment describes in detail the characteristics of the configuration and the manufacturing method of the element isolation region in the memory cell region M. The memory cell region M is driven by a peripheral circuit (not shown) formed in a peripheral circuit region. A peripheral circuit transistor is formed in the peripheral circuit region. The present embodiment is described based on a p-type silicon substrate 2 having transistors Trs and Trn formed therein.

Figure 3:
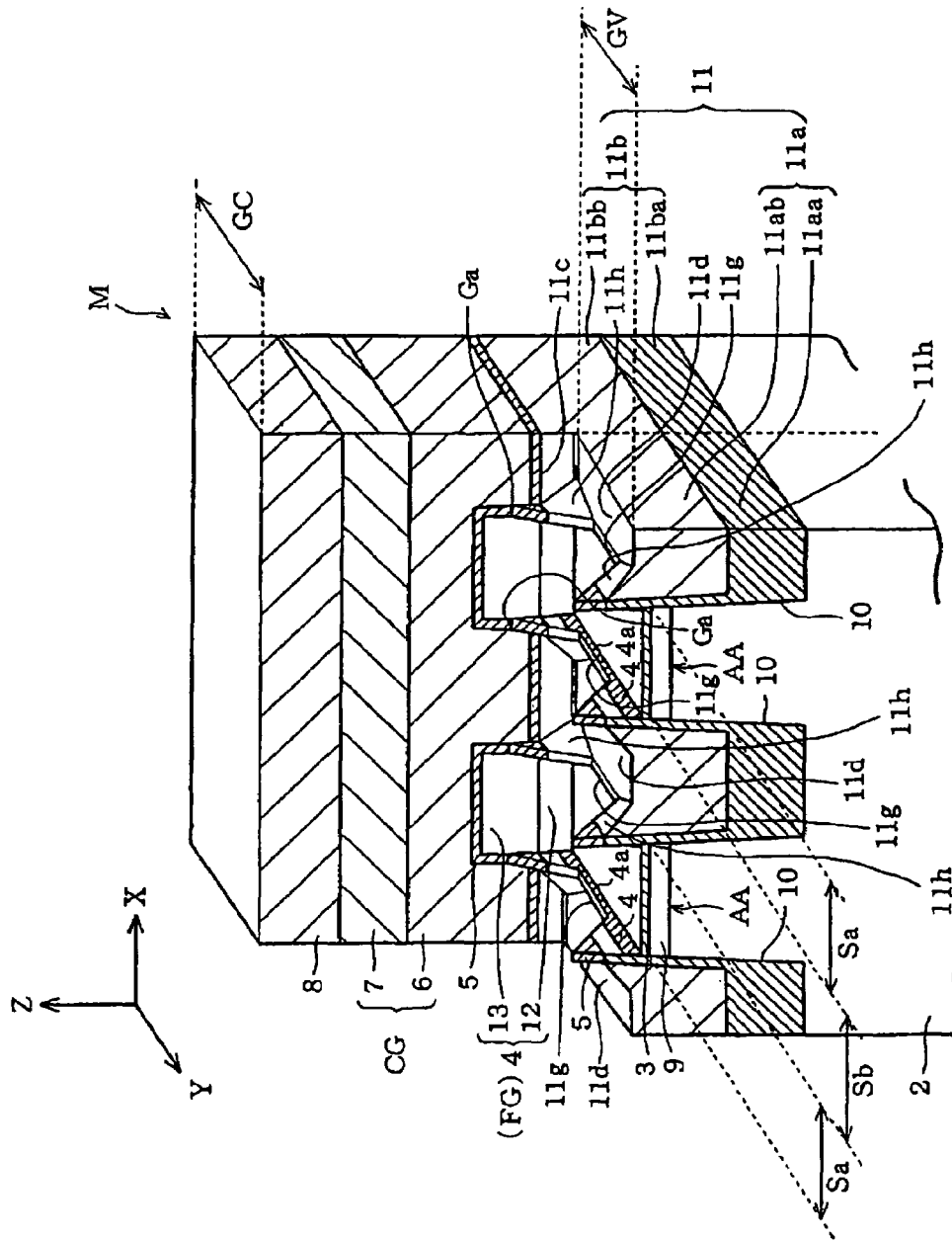
FIG. 3 is a perspective view depicting a schematic structure of a memory cell.

The structures of the memory transistor Trn and the selection gate transistor Trs will be described with reference to FIG. 3. FIG. 3 is a schematic perspective view illustrating one electrode isolation region GV (corresponding to dividing region) and one gate electrode forming region GC shown in the plan view illustrated in FIG. 2. Normally, a NAND flash memory device includes an interlayer insulating film in the gate electrode isolation region GV. However, in view of illustrating only the characterized portions of the present embodiment, the interlayer insulating film is not shown in FIG. 3.

As shown in FIG. 3, formed on the surface of a silicon substrate 2 serving as a semiconductor substrate is a silicon oxide film 3 serving as a gate insulating film (tunnel insulating film), a first polycrystalline film 4 doped with impurities such as phosphorus, an ONO (Oxide-Nitride-Oxide) film 5 serving as an inter-gate insulating film and an inter-poly film, a second polycrystalline silicon film 6, a tungsten silicide (WSi) film 7, and a silicon nitride film 8. The silicon oxide film 3 may be replaced by other gate insulating material, and likewise the ONO film 5 may be replaced by other insulating films. The first and the second polycrystalline film 5 and 6 may also be replaced by other electrically conductive films.

The first polycrystalline film 4 is formed on the silicon oxide film 3. The first polycrystalline film 4 is isolated in the Y-axis direction (predetermined direction) by the gate electrode isolation regions GV so as to constitute a plurality of rows. Each row of the first polycrystalline film 4 is also isolated in the X-axis direction (intersecting direction) by an element isolation region Sb so as to constitute a plurality of columns.

The ONO film 5 is expanded over the plurality of first polycrystalline silicon films 4 aligned in the X-axis direction.

The first polycrystalline silicon film 4 in the gate electrode forming region GC functions as a layer that accumulates electrical charge; in another words, a floating gate electrode FG. The second polycrystalline silicon film 6 and the tungsten silicide film 7 function as a control gate electrode CG (corresponding to control gate electrode) in the gate electrode forming region GC.

The silicon oxide film 3 is formed on a region of the silicon substrate 2 serving both as a gate electrode isolation region GV and the element forming region Sa. A source/drain diffusion layer 9 is formed in the upper surface side of the silicon substrate 2 under the silicon oxide film 3.

In the element isolation region Sb, a trench 10 having a predetermined depth is formed in the predetermined direction (corresponding to Y-axis direction in FIG. 1) in the silicon substrate 2 upper surface (main surface). The trench 10 is filled with an element isolation insulating film 11 so that the height of the upper surface thereof is positioned higher than the silicon oxide film 3. The element isolation insulating film 11 comprises a second element isolation insulator 11a formed on the gate electrode isolation region GV, and a first element isolation insulator 11b formed on the gate electrode forming region GC. The first and the second element isolation insulating regions 11a and 11b are filled in the trench 10 in the same process and the upper surface of the second element isolation insulator 11a is removed thereafter.

The second element isolation insulator 11a of the gate electrode isolation region GV is formed so as to maintain high electrical resistivity between the plurality of element isolation forming region Sa (active region AA) neighboring one another in the X-axis direction. The second element isolation insulating film 11a comprises a silicon oxide film 11aa formed on the inner surface of the trench 10 and a polysilazane film 11ab which is a coat-type oxide film (coat-type insulating film) formed in the inner side of the silicon oxide film 11aa formed in the trench 10.

The second element isolation insulator 11a of the gate electrode isolation region GV is formed in the Z-direction (vertical direction) in relative to the first element isolation insulator 11b boundary. The second element isolation insulator 11a is formed in a substantial U-shape, for example. Hence, the height of the upper surface of a sidewall protruding upward in the Y-axis direction, more specifically, the upper surface of a mid-portion 11g of the sidewall is lower than the upper surface of the edge portion 11c serving as a boundary between the gate electrode forming region GC and the gate electrode isolation region GV.

The first element isolation insulator 11b of the gate electrode forming region GC comprises a silicon oxide film 11ba formed on the inner surface of the trench 10 and the polysilazane film 11bb formed in the inner side of the silicon oxide film 11ba in the trench 10. The silicon dioxide film 11aa and 11ba are made of a HDP-TEOS film, for example. A HDP-TEOS film is an abbreviated term that denotes a TEOS (tetra-ethyl-orthosilicate) film formed by high density plasma chemical vapor deposition process.

In the element isolation region Sb of the gate electrode forming region GC, the ONO film 5, second polycrystalline silicon film 6, tungsten silicon film 7, and silicon nitride film 8 are deposited on the first element isolation insulator 11b.

As shown in FIG. 3, the ONO film 5 is formed in the gate electrode forming region GC so as to cover the first polycrystalline silicon film 4 and the element isolation insulating film 11 formed therein. Also, the ONO film 5 is also formed on the gate electrode isolation region GV is formed along the edge portion 11c of the gate electrode forming region GC boundary and is formed in a substantially triangular shape so as to contact the second element isolation insulating film 11a disposed below an ONO film boundary Ga.

At this time, the central portion 11d of the second element isolation insulator 11a in the gate electrode isolation region GV is formed in level with the height of the upper surface of the sidewall mid-portion 11g protruding upward in the Y-axis direction from the silicon substrate 2. That is, the height of the sidewall mid-portion 11g and the central portion 11d of the second element isolation insulator 11a are arranged to be lower than the height of the edge portion 11c serving as a boundary between the first and the second element isolation regions 11b and 11a.

In the conventional manufacturing process, the sidewall mid-portion 11g of the second element isolation insulator 11a is not arranged to be lower than the edge portion 11c serving as the gate electrode forming region GC boundary. As a result, the first polycrystalline silicon film 4 remains at the side of the second element isolation insulator 11a in the Y-axis direction. Thus, even if thermal oxidation process is performed in the subsequent process, the remainder film 4a underlying the film surface remains unoxidized in case the thermal treatment does not reach sufficient depth.

According to the present embodiment, the upper surface of the sidewall mid-portion 11g of the second element isolation insulator 11a is formed in a substantially U-shape so as to be lower than the height of the edge portion 11c serving as the gate electrode forming region GC boundary. Consequently, the remainder film 4a is less prone to remain in the Y-axis direction at the side of the sidewall mid-portion 11g of the second element isolation insulator 11a. Hence, the remainder film 4a if any, is thinner compared with the conventional film thickness, therefore is more responsive to oxidation. Thus, no connection is established between the neighboring floating gate electrodes FG by the first polycrystalline silicon film 4, thereby preventing electrical conductivity therebetween that may lead to potential drawbacks.

Figure 4A:
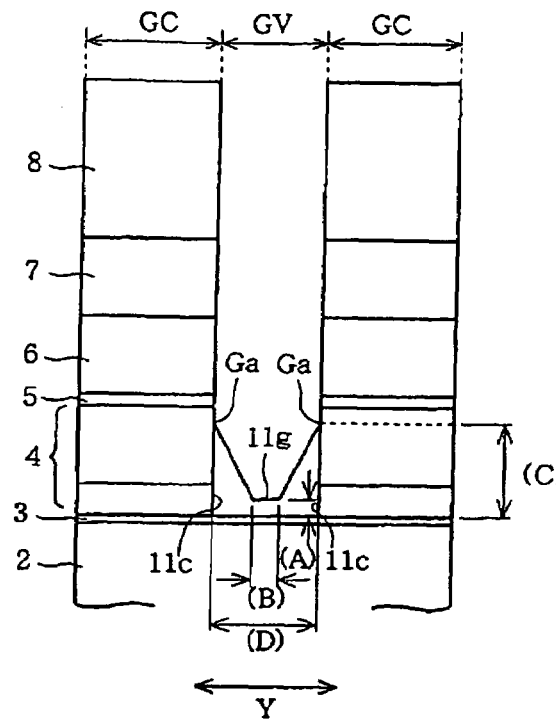
FIG. 4A shows dimensions of a main portion an element isolation insulating film.
Figure 4B:
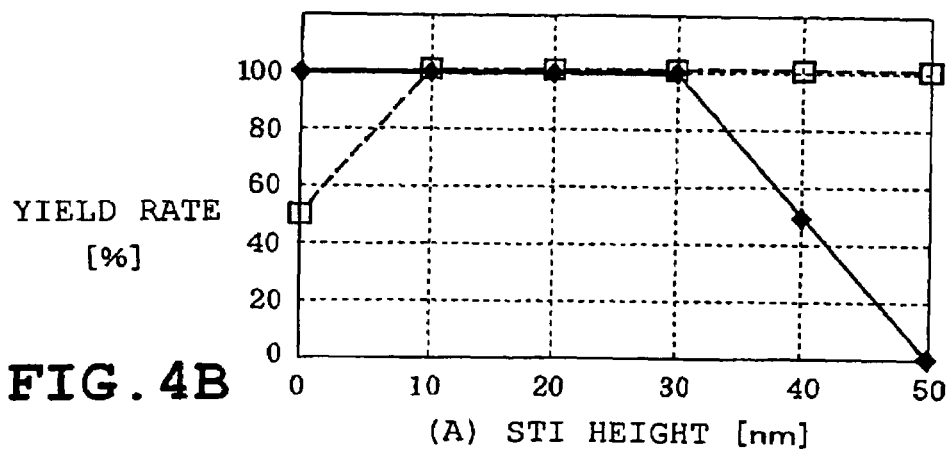
FIG. 4B shows a relation between an upper surface of the element isolation insulating film and a yield rate.
Figure 4C:
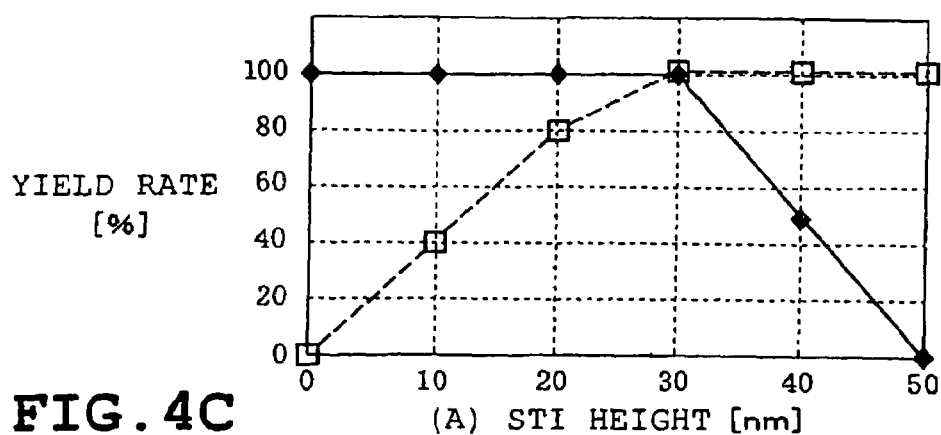
FIG. 4C is a comparative variation of FIG. 4B indicating yield rate of a different configuration.

Referring to FIGS. 4A to FIG. 4C, the graphs indicate design parameters and the corresponding yield rates of the first and the second element isolation insulators 11a and 11b described in the present embodiment. FIG. 4B indicates the resultant yield rates when various design parameters are applied to the structure according to the present embodiment. FIG. 4C indicates the resultant yield rates in case the upper portion of the second element isolation insulator 11a is not processed in accordance with the present embodiment but is planarized instead to adjust the height of the upper surface thereof. In FIG. 4C, the lateral axis represents the height of the upper surface of the second element isolation insulator 11a. The label "STI height" in FIG. 4B denotes the height (A) of the sidewall mid-portion 11g in FIG. 4A.

The white squares plotted in FIGS. 4B and 4C indicate the yield rate pertaining to junction leak current characteristics in relative to the height of the second element isolation insulator 11a upper surface.

It has been found by the inventors that junction leak-current characteristic degradation originates in the manufacturing phase in which the polycrystalline silicon film 4 is formed by etch process. More specifically, the cause of the degradation lies in the undercutting of the element forming region Sa (active region AA) under the silicon oxide film 3 and the silicon substrate 2 surface.

Also, the diamonds plotted in FIGS. 4B and 4C represent the characteristics of the yield rate calculated based on whether the polycrystalline silicon films 4 of the gate electrode forming regions GC are electrically shorted with one another or not.

FIG. 4C represents the case where the entire upper surface of the second element isolation insulator 11a of the gate electrode isolation region GV is planarized. As can be observed from FIG. 4C, when the height of the element isolation insulator upper surface of the gate electrode isolation region GV exceeds 30 [nm], the polycrystalline silicon films 4 of the neighboring gate electrode forming regions GC become more susceptible to being short-circuited with one another, thereby deteriorating the yield rate.

This susceptibility is due to the increased tendency of the polycrystalline film 4 remaining at the side of the second element isolation insulator 11a. As opposed to this, the degradation of junction leak current characteristic is observed when the height of the element isolation insulator upper surface of the gate electrode isolation region GV is lower than 30 [nm]. This is due to the reduced height of the element isolation insulator 11a upper surface in the gate electrode isolation region GV, particularly in the proximity of the sidewall edge portion 11c. Such reduction increases the possibility of the silicon oxide film 3 (serving as the gate insulating film) and the silicon substrate 2 being etched undesirably during the etch process of the polycrystalline silicon film 4, thus degrading the junction leak characteristic.

FIG. 4B shows the yield rate of the manufacturing method in accordance with the present embodiment. As can be seen in FIG. 4B, the junction leak current characteristic is improved as compared with FIG. 4C, especially when the height (A) of the sidewall mid-portion 11g from the upper surface of the silicon oxide film 3 is in the range of 0 [nm]<(A)<30 [nm]. This may be attributable to the second element isolation insulator 11a being formed higher than the sidewall mid-portion 11g of the second element isolation insulator 11a along the edge portion 11c of the first element isolation insulator 11b. In other words, the second element isolation insulator 11a acts to lower the etching speed of the polycrystalline film 4 especially in the edge portion 11c side, providing protection to the silicon oxide film 3 or the silicon substrate 2.

In other words, the junction leak current characteristic is improved because the proximity of the central portions of the region interposing the neighboring gate electrode forming regions GC are removed with the second element isolation isolator 11a and ONO film 5 remaining in the edge portion 11c.

It is preferable to establish a relation of (C)>2×(A) between the height (A) of the sidewall mid-portion 11g of the second element isolation insulator 11a and the height (C) from the silicon oxide film 3 upper surface and the boundary Ga on the edge portion 11c. In such case, the higher the height of the second element isolation region insulator 11a formed along the edge portion 11c, the higher the yield rate and non-defective ratio of the manufacturing process as compared with the conventional configuration.

Also, it is preferable to establish a relation of (B)<(D)/3 between the length (B) in the Y-axis direction of the sidewall mid-portion 11g of the second element isolation insulator 11a and the distance between the neighboring gate electrode forming regions GC (D) (the distance between confronting edge portions 11c of the element isolation insulator 11b).

According to the present embodiment, in the region where the gate electrode isolation region GV and the element isolation region Sb overlap, the second element isolation insulator 11a is formed along the edge portion 11c of the first element isolation insulator 11b. Also, the second element isolation insulator 11a and the ONO film 5 take on a recessed profile, when approaching the sidewall mid-portion 11g in the proximity of the central portion between the edge portions 11c of the first element isolation insulator 11b neighboring the second element isolation insulator 11a in the Y-axis direction from the boundary Ga. Therefore, the first polycrystalline film 4 becomes less prone to remain at the side of the sidewall mid-portion 11g in the Y-axis direction (trench forming direction) of the second element isolation insulator 11a of the gate electrode isolation region GV. Therefore, the first polycrystalline silicon film 4 in the gate electrode isolation region GV can be prevented from connecting the neighboring floating gate electrodes FG, thereby preventing defects and establishment of electrically conductive connection therebetween.

A method of manufacturing a memory cell region of a NAND type nonvolatile storage device will be described in detail hereinafter. The pre-fabrication process is a process that forms floating gate electrode FG prior to the element isolation region Sb. It is to be noted that some of the process which will be described hereinafter may be omitted on a required basis to the extent that the object of the present invention can be obtained. Likewise, well-known process may be added in view of realizing the present invention.

Figure 5:
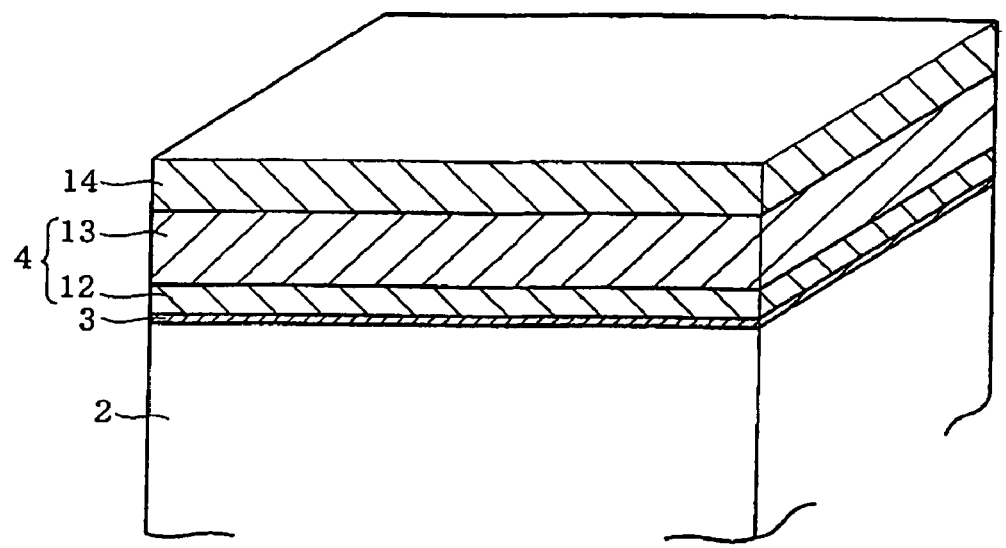
FIGS. 5 to 18 is a perspective view indicating a part of a memory cell undergoing a sequence of manufacturing process (steps 1 to 14).

First, the process involved in obtaining the configuration shown in FIG. 5 will be explained sequentially. A gate insulating film made of a silicon oxide film 3 is formed on a silicon substrate 2 in a film thickness of 10 [nm], for example by thermal oxidation process. Next, a polycrystalline silicon film 12 is formed on the silicon oxide film 3 by LPCVD (Low-Pressure Chemical Vapor Deposition) process in a film thickness of 40 [nm], for example. Then, a polycrystalline silicon film 13 doped with n-type impurities is formed on the polycrystalline silicon 12 by LPCVD process in a film thickness of 40 [nm], for example. The polycrystalline silicon films 12 and 13 serves as a floating gate electrode film and are processed into a polycrystalline silicon film 4 in the final form of the manufacturing process. Hence, the polycrystalline silicon films 12 and 13 are identified with a reference character 4 in FIG. 5.

After forming the polycrystalline silicon film 13 on top of the polycrystalline silicon film 12, a silicon nitride film 14 is formed on the polycrystalline silicon film 13 by LPCVD process in a thickness of 70 [nm], for example. The resultant configuration is shown in FIG. 5

Figure 6:
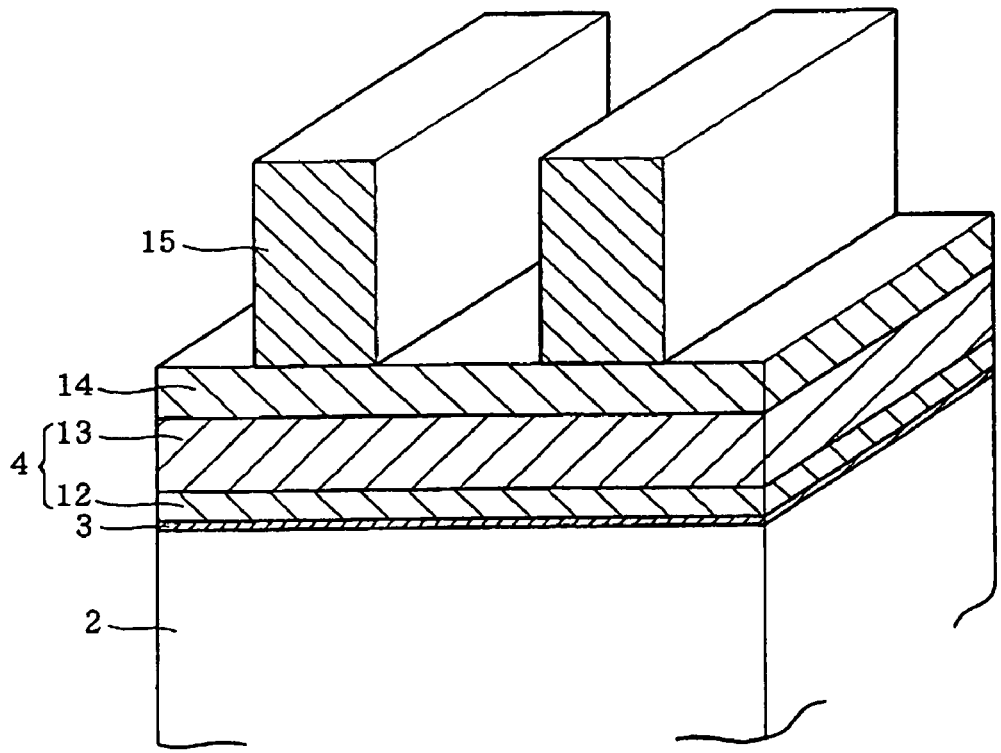
Figure 7:
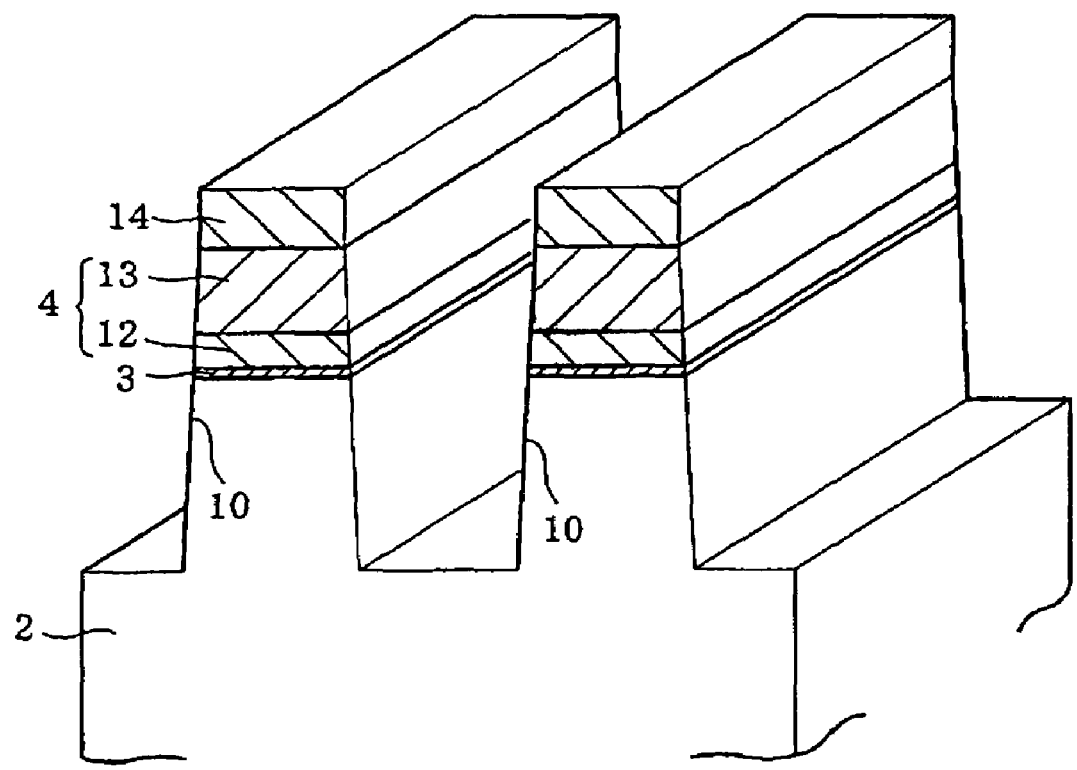

Subsequently, as shown in FIG. 6, a pattern is printed on the resist coated over the silicon nitride film 14 by lithography technique. Then, using the patterned resist 15 as a mask, a plurality of trenches 10 are formed so as to be aligned in a predetermined direction (Y-axis direction) by etching the polycrystalline silicon film 13 doped with impurities, the polycrystalline silicon film 12, and the silicon oxide film 3 by RIE process. Thereafter, the resist 15 is removed by ashing technique. Thus, as shown in FIG. 7, the polycrystalline silicon films 13 and 12 and the silicon oxide film 3 are divided. The polycrystalline silicon films 12 and 13 at this point are in a tapered form.

Figure 8:
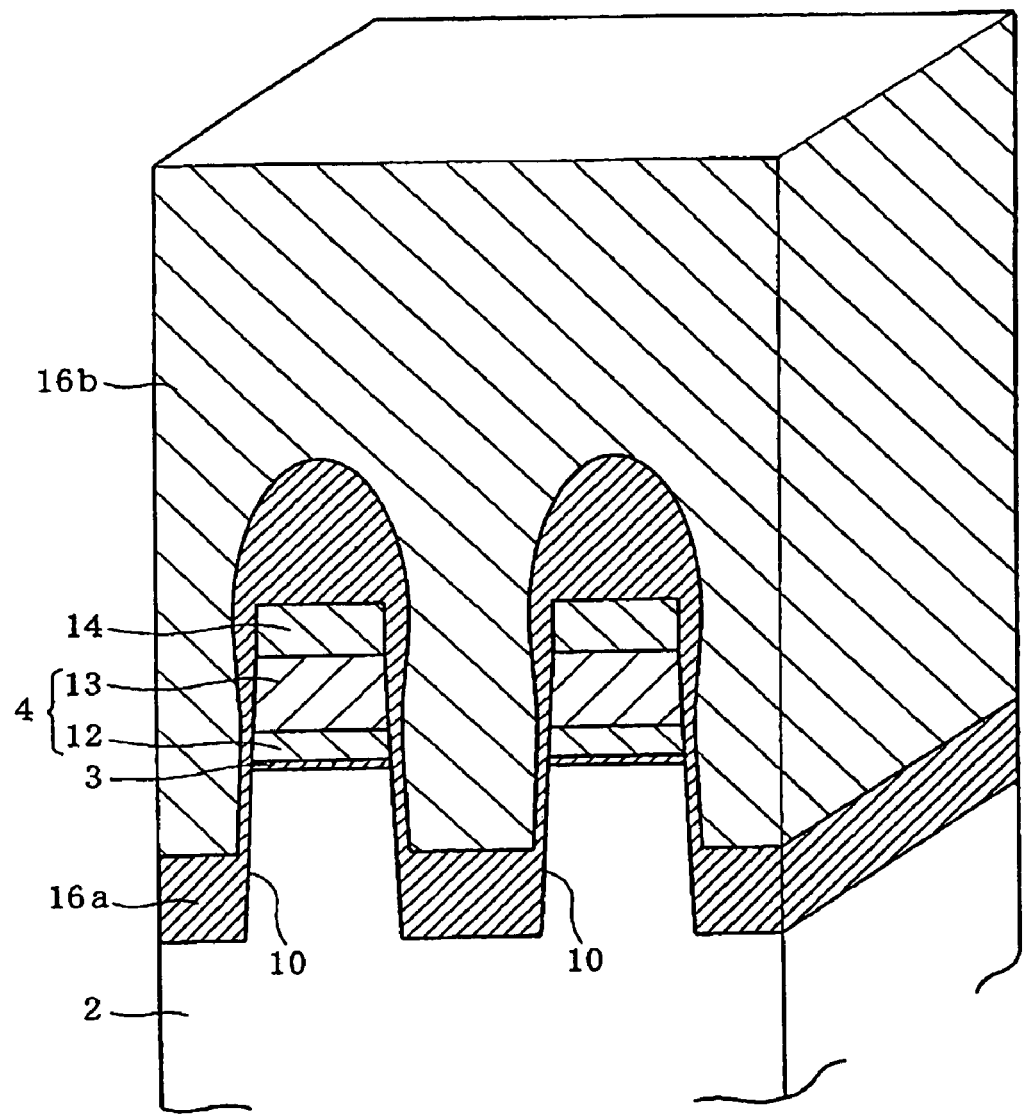

Next, as shown in FIG. 8, a silicon oxide film 16a is further deposited by HDP (High Density Plasma)-CVD process in a film thickness of 170 [nm], for example, whereupon a polysilazane (Si—NH) film 16b is formed in a thickness of 400 [nm], for example. Then, the polysilazane film 16b is converted into a silicon oxide film by thermal treatment performed in an oxidation atmosphere on the order of 400° C. to 500° C. and further undergoes thermal treatment in an inactive atmosphere on the order of 800° C. to 900° C. The silicon oxide film 16a and the polysilazane film 16b constitute the element isolation insulating film 11 in the final phase of the manufacturing process.

Figure 9:
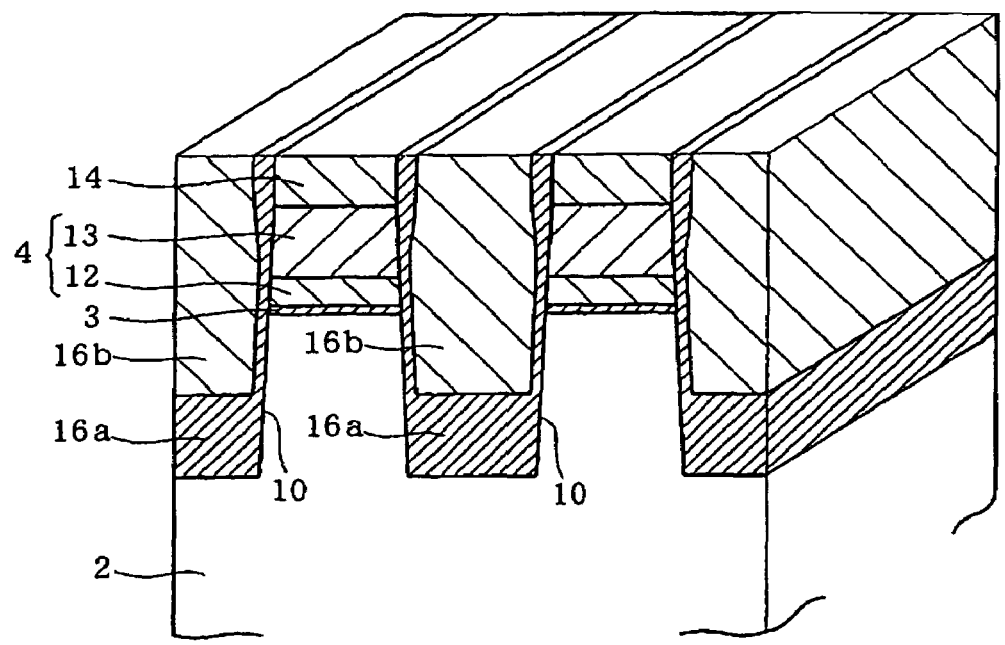
Figure 10:
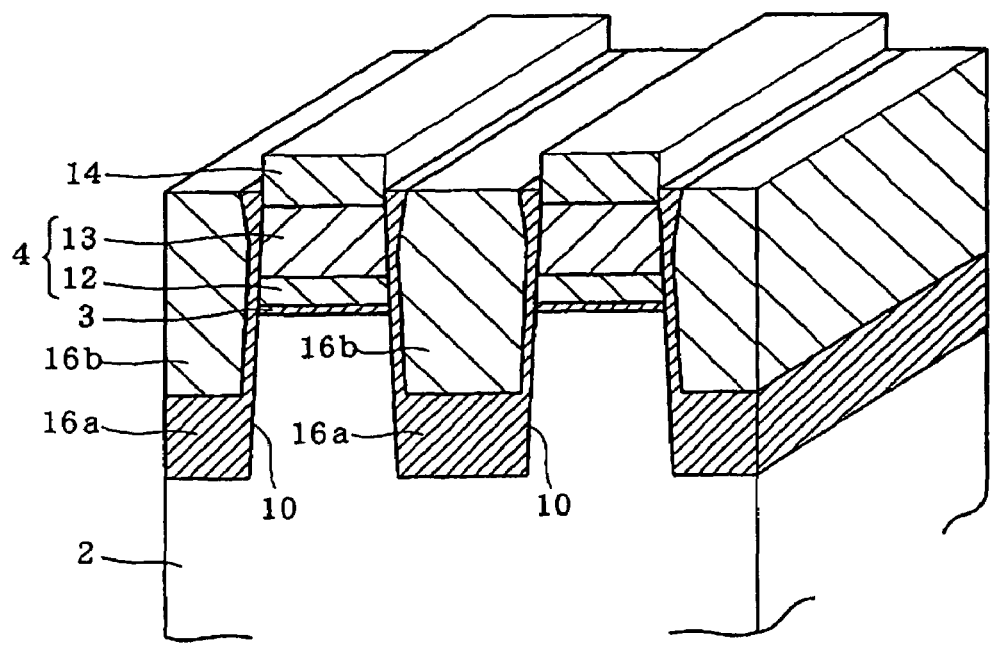

Next, as shown in FIG. 9, the silicon oxide film 16a and the polysilazane film 16b are planarized until the surface of the silicon nitride film 14 is exposed by CMP process. Then, as shown in FIG. 10, the surfaces of the polysilazane film 16b and the silicon oxide film 16a are etched by RIE method by 50 [nm], for example.

Figure 11:
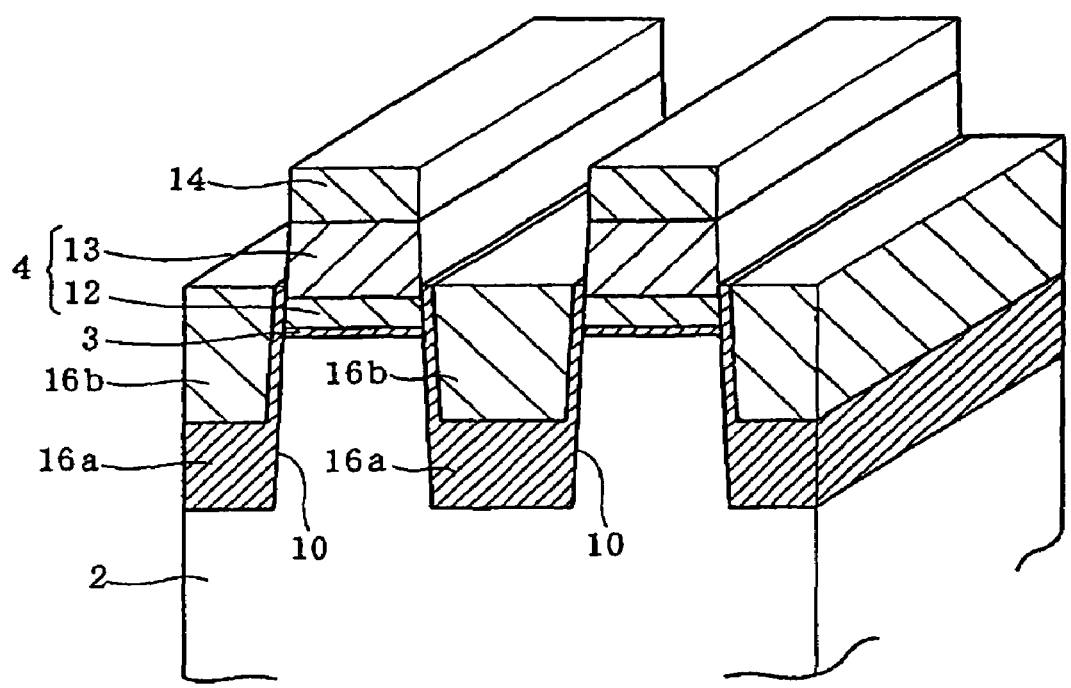

Subsequently, as shown in FIG. 11, the surfaces of the polysilazane film 16b and the silicon oxide film 16a are etched by 100 [nm], for example. Successively, the patterned resist as well as the silicon nitride film 14 are removed by ash cleaning technique. As a result, the upper surfaces of the polysilazane film 16b and the silicon oxide film 16a are positioned higher than the upper surface of the silicon oxide film 3 and lower than the upper surface of the polycrystalline silicon film 13.

Figure 12:
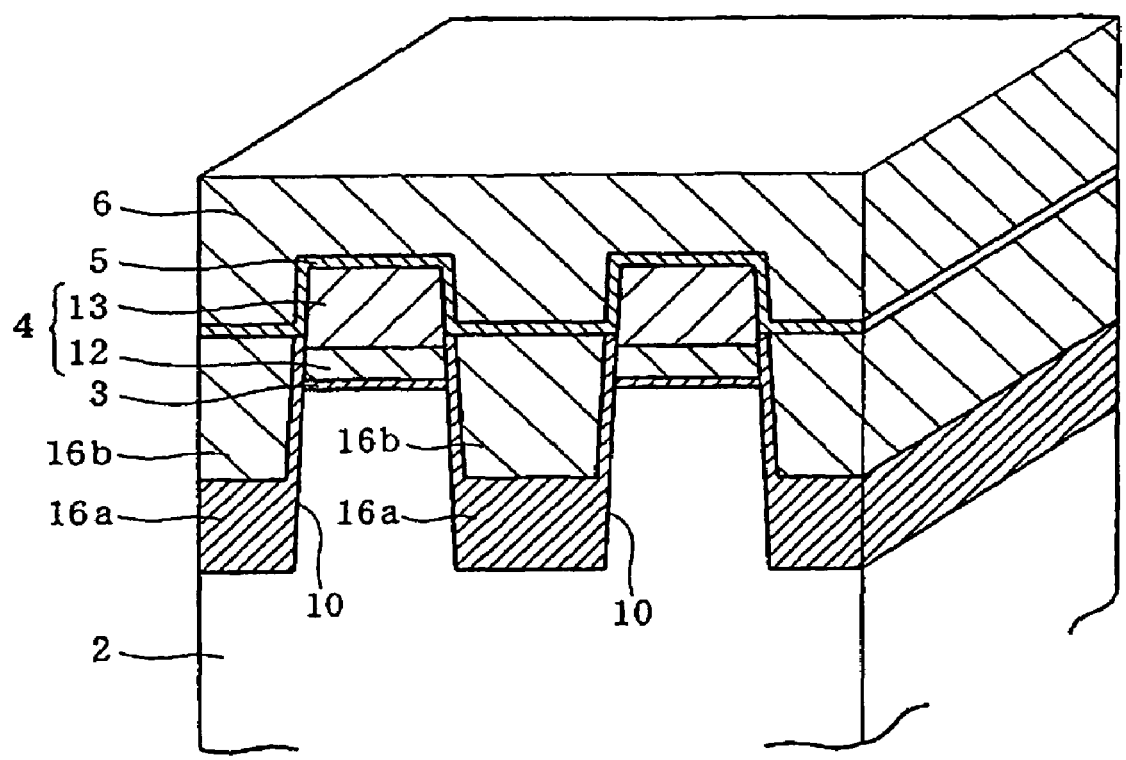

Next, as shown in FIG. 12, an ONO film 5 is formed by LPCVD process so as to cover the entire surface on the order of 15 to 17 [nm], whereafter a second polycrystalline film 6 doped with impurities such as phosphorus is formed thereon.

Figure 13:
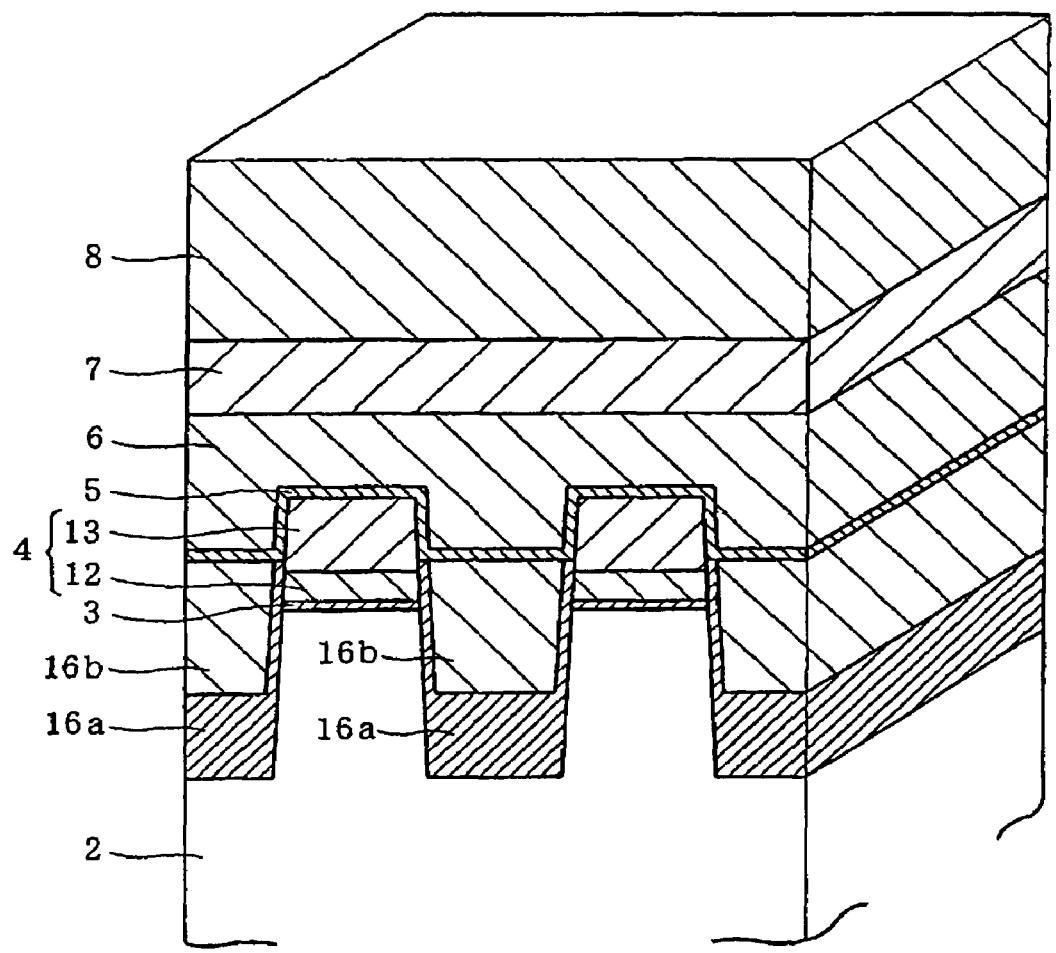
Figure 14:
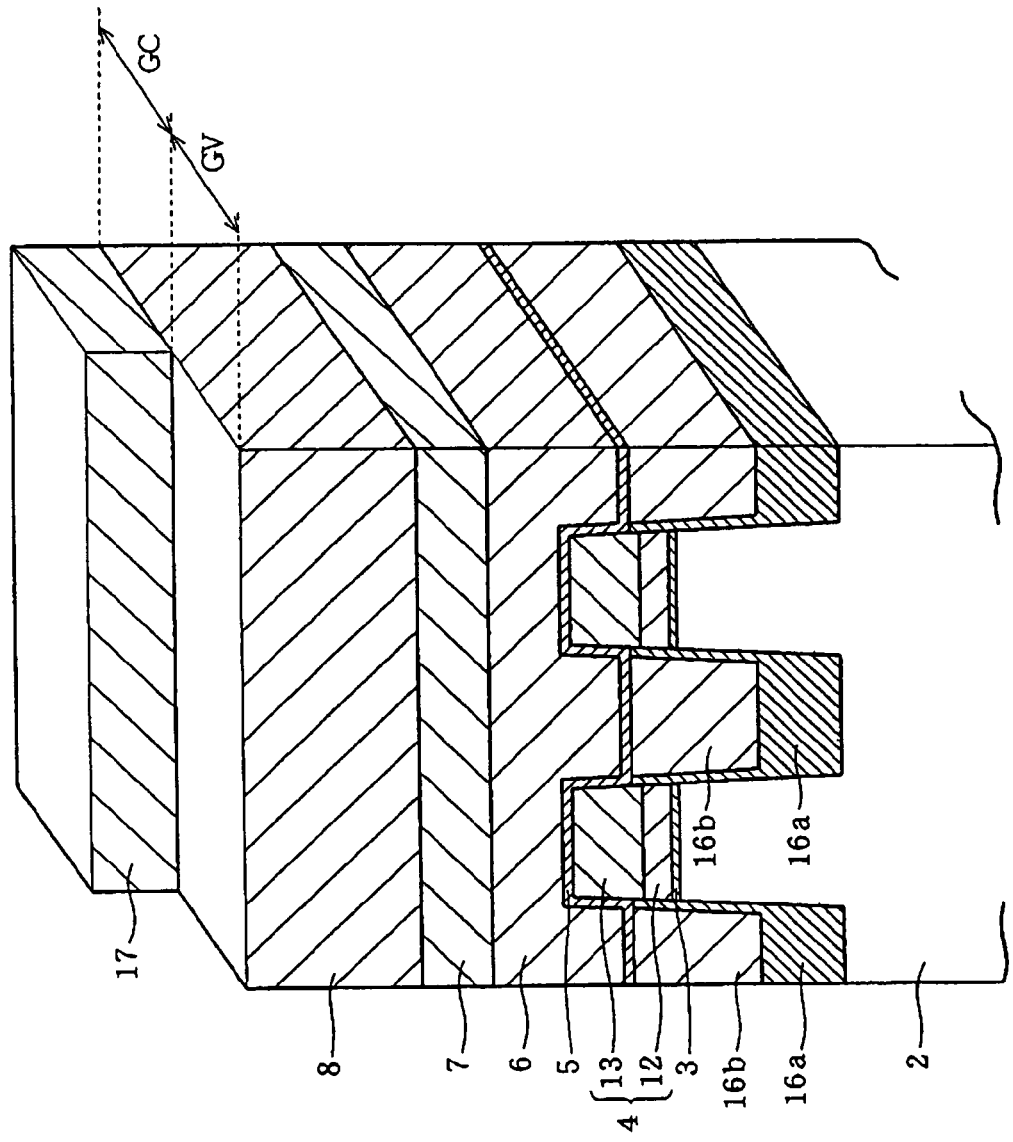

Successively, as shown in FIG. 13, a tungsten silicide film 7 is formed by sputtering process. The second polycrystalline silicon film 6 and the tungsten silicide film 7 constitute a control gate electrode film. Next, the silicon nitride film 8 is formed further on top by LPCVD process on the order of 300 [nm], whereupon a resist 17 is coated and patterned thereafter, as shown in FIG. 14. More specifically, the resist 17 is patterned so as to expose the upper surface of the silicon nitride film 8 in the gate electrode isolation region GV(constituting the dividing region) and to mask the gate electrode forming region GC.

Figure 15:
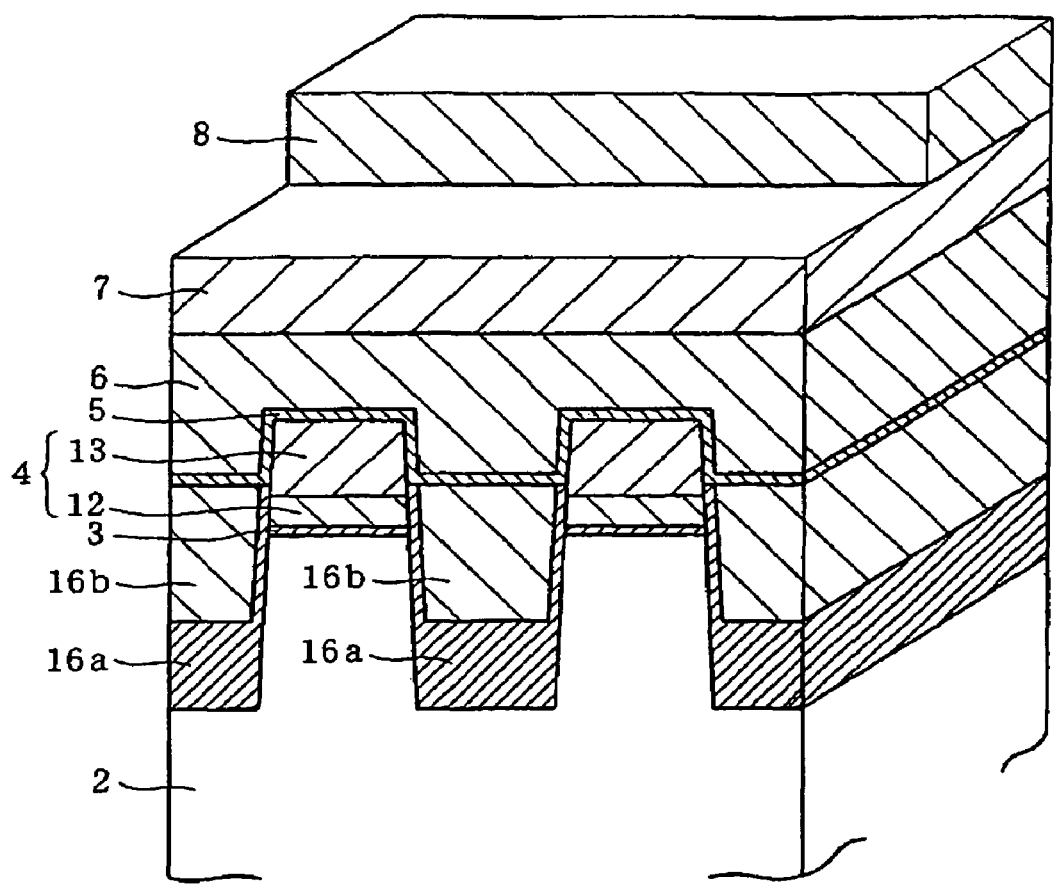

Next, as shown in FIG. 15, using the patterned resist 17 as a mask, a part of the silicon nitride film 8 is removed by RIE process so as to divide the silicon nitride film 8 and the resist 17 is removed by ash cleaning technique.

Figure 16:
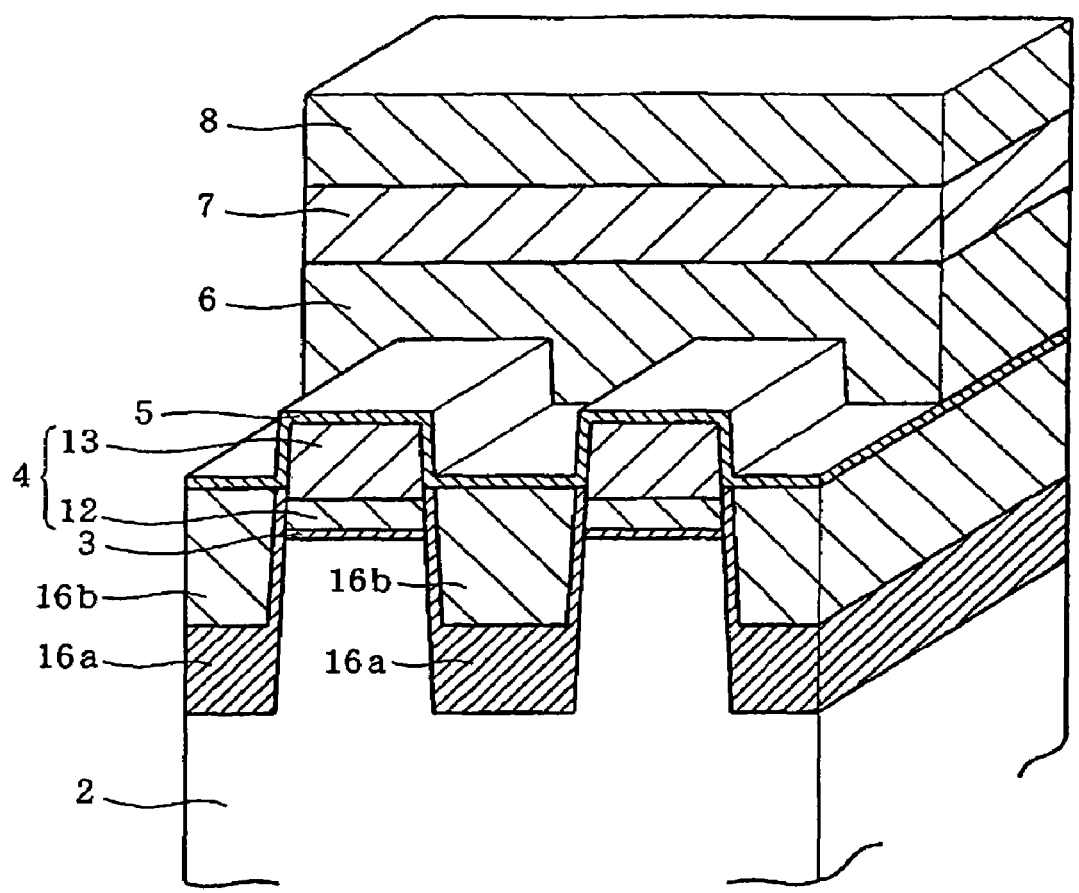

Next, as shown in FIG. 16, using the silicon nitride film 8 as a mask, the exposed tungsten silicide film 7 and the second polycrystalline silicon film 6 formed thereunder is divided by being etched by RIE process with a higher selective ratio in relative to the ONO film 5. Then, the selective ratio is altered so that the ONO film 5, the polysilazane film 16b and the silicon oxide film 16a are etched with higher selectivity in relative to polycrystalline silicon by the same RIE device.

Figure 17:
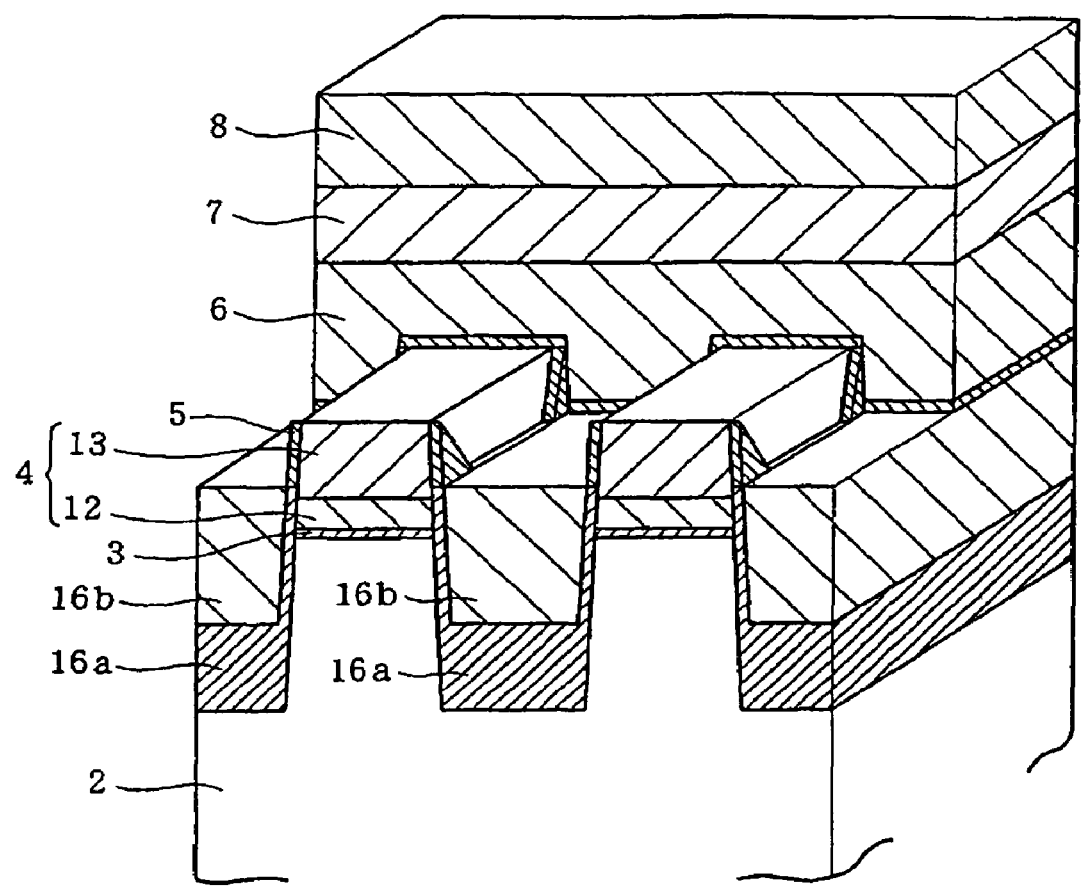

That is, the ONO film 5 formed on the polycrystalline silicon film 13 in the gate electrode isolation region GV is removed as shown in FIG. 17. At the same time, the upper portion of the polysilazane film 16b and the silicon oxide film 16a in the gate electrode isolation region GV are etched away. It appears from FIGS. 17 and 18 that there is a pause after the process of removing the upper portion of the polysilazane film 16b and the silicon oxide film 16a. However, this process is actually performed simultaneously. The intention of FIGS. 17 and 18 is to provide better clarity of the shape change resulting from the process.

Figure 18:
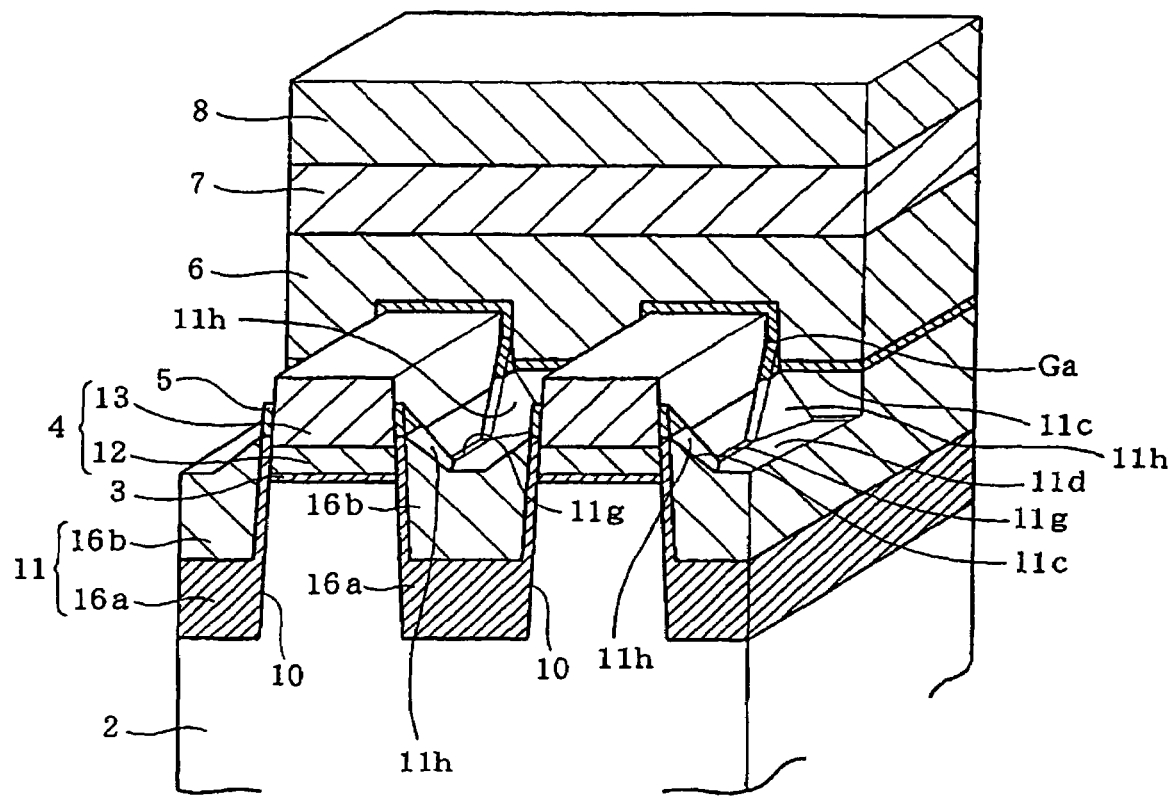

At this point, as can be seen in FIG. 18, the polysilazane film 16b and the silicon oxide film 16a in the gate electrode isolation region GV remain along the edge portion 11c of the polysilazane film 16b and the silicon oxide film 16a in the gate electrode forming region GC. More specifically, the polysilazane film 16b and the silicon oxide film 16a in the gate electrode isolation region GV remain in four corners (refer to reference character 11b in FIG. 18). That is, the four corners surrounded by, for example, the polycrystalline silicon films 13 and 12 in the gate electrode isolation region GV and the second polycrystalline silicon film 6, the ONO film 5, the polysilazane film 16b, silicon oxide film 16a in the gate electrode forming region GC.

In another words, as shown in FIG. 18, the polysilazane film 16b of the gate electrode isolation region GV is formed such that the central portion 11d in the substantial center of the region interposed between the neighboring divided gate electrode forming regions GC is in a recessed profile. At this time, the polysilazane film 16b and silicon oxide film 16a constituting the sidewall of the polycrystalline silicon films 12 and 13 in the gate electrode isolation region GV are formed such that the height of the sidewall mid-portion 11g in Y-axis direction is formed lower than the edge portion 11c serving as the boundary between the gate electrode forming region GC and the gate isolating region GV.

Next, as show in FIG. 3, the polycrystalline silicon films 13 and 12 of the gate electrode isolation region GV are etched by RIE process (corresponding to anisotropic etch) with a higher selectivity in relative to the silicon oxide film 3. As shown in FIG. 18, the polycrystalline silicon films 13 and 12 take on a positive taper in relative to the silicon oxide film 3. Hence, even if the polycrystalline silicon films 13 and 12 are etched by RIE process, the polycrystalline film 4 remains on the sidewall of the polysilazane film 16b and the silicon oxide film 16a in the gate electrode isolation region GV as shown as the remainder film 4a in FIG. 3.

However, in the present embodiment, the etch process of the gate electrode isolation region GV is carried out in three steps. The first step removes the tungsten silicide film 7 and polycrystalline silicon film 6. The second step removes the ONO film 5, polysilazane film 16b and silicon oxide film 16a. Finally, the third step removes the polycrystalline silicon films 13 and 12.

As described above, the polysilazane film 16b and the silicon oxide film 16a are removed before removing the polycrystalline silicon films 13 and 12 in the gate electrode isolation region GV by RIE process. At this time, the sidewall mid-portion 11g of the polysilazane film 16b and silicon oxide film 16a of the gate electrode isolation region GV is formed in a low profile so as to form a recess. As a result, the remainder film 4a becomes less prone to remain on the sidewall. Thus, the possibility of the polycrystalline silicon films 4 (especially the polycrystalline silicon films 12) of the gate electrode forming regions GC establishing electrically conductive connection with one another can be reduced.

Thereafer, by performing thermal oxidation process, the remainder film 4a is fully oxidized. In such case, the depth of oxidation process inherently varies depending on the condition applied to the oxidation process and conditional thermal oxidation process is only effective to a limited film thickness. However, the thickness of the remainder film 4a in the present embodiment is small compared with conventional practice, thereby improving the yield rate.

That is, because the remainder film 4a remaining between the neighboring gate electrode forming regions GC, especially at the side of the sidewall mid-portion 11g is oxidized, the polycrystalline silicon films 4 formed in the gate electrode forming regions GC can be prevented from being electrically conducted with one another.

Moreover, the second element isolation insulator 11a (polysilazane film 16b and silicon oxide film 16a) in the gate electrode isolation region GV remains along the edge portion 11c (in four corners as described specifically earlier) serving as the boundary between the gate electrode isolation region GV and the gate electrode forming region GC. Hence, in the proximity of the boundary between the gate electrode forming region GC and the gate electrode isolation region GV, the second element isolation insulator 11a is able to maintain the gate insulating function of the silicon oxidation film 3 of protecting the active area AA. The reliability of the device is improved by the above characteristics.

Thereafter, NAND type non-volatile semiconductor memory device is completed by forming a source/drain diffusion layer 9, various interlayer insulating films (not shown) and interconnection layers (not shown), and other upper layer film forming process further followed by the backend process. Such process, being irrelevant to the process at issue, is not described in detail in the present embodiment.

The manufacturing method according to the present embodiment provides the following effects. By removing the second polycrystalline silicon film 6 and the tungsten silicide film 7 in the X-axis direction, the second polycrystalline film 6 and the tungsten silicide film 7 are divided into plurality. Then, the ONO film 5 formed on the polycrystalline silicon film 16a is removed by removing the ONO film 5, the polysilazane film 16b and the silicon oxide film 16a under higher selectivity in relative to the second polycrystalline silicon film 6 and the tungsten silicide film 7. Also, the ONO film 5 and the second element insulator 11a in the central portion 11d (especially sidewall mid-portion 11g) of the gate electrode isolation region GV is removed with the element isolation insulator 11a remaining along the edge portion 11c of the ONO film 5 and the first element isolation insulator 11b (polysilazane film 16b and silicon oxide film 16a) in the gate electrode forming region GC. Thereafter, since the polycrystalline silicon films 13 and 12 are removed by RIE process. Due to the above described characteristics, the remainder film 4a is less prone to remain at the side of the central portion 11d (sidewall mid-portion 11g) of the gate electrode isolation region GV as compared with the configuration in which the upper portions of the polysilazane film 16b and the silicon oxide film 16a are planarized. As a result, the first polycrystalline films 4 in the gate electrode forming regions GC can be prevented from being electrically conductive with one another. Thereafter, the remainder film 4a is oxidized by thermal oxidation process, or the like. Hence, prevention of electrical conductive connection can be reinforced all the more.

Also, the substantial central portion of the region between the neighboring gate electrode forming regions GC is removed with the second element isolation insulator 11a remaining on the edge portion 11c side of the first element isolation insulator 11b. Thus, the junction leak current characteristic can be improved also.

The present invention is not limited to the above embodiments but may be modified or expanded as follows.

In alternative to the silicon substrate 2, other types of semiconductor substrates may be employed to the present invention.

The present invention may be applied to any semiconductor device as long as the semiconductor device employs a memory structure having floating electrodes aligned in the Y-axis direction (predetermined direction) and the X-axis direction (intersecting direction) respectively.

The X-axis and the Y-axis generally form a 90 degree angle; however, an obtuse or an acute angle may be formed alternatively.

The present invention is not limited to a flash memory device 1, but may be applied to other EEPROM, EPROM, NOR flash memory device, and further to other non-volatile semiconductor memory device, semiconductor memory device, and semiconductor device.

The foregoing description and drawings are merely illustrative of the principles of the present invention and are not to be construed in a limited sense. Various changes and modifications will become apparent to those of ordinary skill in the art. All such changes and modifications are seen to fall within the scope of the invention as defined by the appended claims.

What is claimed is:

1. A semiconductor device comprising:
    a semiconductor substrate having a plurality of trenches formed therein so as to be oriented in a first direction;
    a gate insulating film formed on the semiconductor substrate surface interposed between the plurality of trenches;
    a plurality of floating gate electrodes formed on the gate insulating film so as to be aligned in the first direction and in a second direction perpendicular to the first direction within the plane of the surface of the semiconductor substrate;
    an element isolation insulating film that fills the plurality of trenches respectively such that an upper surface thereof is positioned higher than an upper surface of adjoining gate insulating film, wherein the element isolation insulating film includes a first element isolation insulator interposed between neighboring floating gate electrodes in the second direction and a second element isolation insulator interposed between neighboring first element isolation insulators in the first direction, wherein the second element isolation insulator has a sidewall oriented in the first direction, a height of a substantial mid-portion of the sidewall from the gate insulating film upper surface being lower than a boundary between the first element isolation insulator and the second isolation insulator.

2. The device according to claim 1, wherein the second element isolation insulator includes a planarized portion having a substantial central portion thereof in a recessed profile.

3. The device according to claim 2, wherein the second element isolation insulator is formed so as to establish a relation of 0 [nm]<(A)<30 [nm], (B)<(D)/3, and (C)>2×(A) between a sidewall height (A) of the substantial central portion, a length of the planarized portion (B), a sidewall height of the boundary (C), and a distance between neighboring first element isolation insulators (D).

4. A method of manufacturing a semiconductor device comprising:
    forming a gate insulating film on a semiconductor substrate surface;
    forming a floating gate electrode film on the gate insulating film;
    dividing the floating gate electrode film and the gate insulating film into plurality by forming trenches oriented in a predetermined direction, with respect to the floating gate electrode film, the gate insulating film and the semiconductor substrate;
    forming an element isolation insulating film in the trench so that an upper surface thereof becomes lower than a floating gate electrode film upper surface and higher than a gate insulating film upper surface;
    forming an inter-gate insulating film so as to cover the floating gate electrode film and the element isolation insulator film;
    forming a control gate electrode film on the inter-gate insulating film;
    dividing the control gate electrode film into plurality by removing the inter-gate insulating film and the element isolation insulating film in an intersecting direction that intersects the predetermined direction;
    removing the inter-gate insulating film and the element isolation insulating film in a substantial central portion below a control gate electrode film removing region, wherein in a dividing region in which the control gate is divided, the inter-gate insulating film formed on the floating gate electrode film is removed by removing the inter-gate insulating film and the element isolation insulating film disposed below the control gate electrode film removing region while retaining the inter-gate insulating film and the element isolation insulating film along an edge portion of the inter-gate insulating film and the element isolation insulating film formed below the divided control gate electrode film; and
    removing the floating gate electrode film in the dividing region by an anisotropic etch.

5. The method according to claim 4, wherein the step removing the inter-gate insulating film and the element isolation insulating film below the control gate electrode film removing region removes the substantial central portion so as to define a recess with respect to the predetermined direction.

* * * * *